(12) United States Patent
Shi et al.

(10) Patent No.: US 11,973,166 B2
(45) Date of Patent: Apr. 30, 2024

(54) METHOD FOR FABRICATING DISPLAYING BASE PLATE, DISPLAYING BASE PLATE AND DISPLAYING DEVICE

(71) Applicant: BOE Technology Group Co., Ltd., Beijing (CN)

(72) Inventors: Lubin Shi, Beijing (CN); Bin Qin, Beijing (CN); Liang Chen, Beijing (CN); Dongni Liu, Beijing (CN); Fangzhen Zhang, Beijing (CN); Ke Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 233 days.

(21) Appl. No.: 17/340,672

(22) Filed: Jun. 7, 2021

(65) Prior Publication Data

US 2022/0059728 A1 Feb. 24, 2022

(30) Foreign Application Priority Data

Aug. 19, 2020 (CN) .......................... 202010838675.9

(51) Int. Cl.
*H01L 33/48* (2010.01)
*H01L 25/075* (2006.01)

(52) U.S. Cl.
CPC ........ *H01L 33/486* (2013.01); *H01L 25/0753* (2013.01); *H01L 2933/0016* (2013.01); *H01L 2933/0066* (2013.01)

(58) Field of Classification Search
CPC ............. H01L 33/62; H01L 2933/0016; H01L 25/0753; H01L 33/486; H01L 2933/0066
See application file for complete search history.

(56) References Cited

U.S. PATENT DOCUMENTS

| | | | |
|---|---|---|---|
| 2015/0279872 A1* | 10/2015 | Kato | H01L 27/1255 257/532 |
| 2016/0043345 A1* | 2/2016 | Goden | H10K 59/121 257/40 |
| 2021/0408350 A1* | 12/2021 | Lo | H01L 24/10 |
| 2022/0229506 A1* | 7/2022 | Li | G06F 3/0443 |
| 2023/0055222 A1* | 2/2023 | Jeong | H01L 21/28 |

* cited by examiner

*Primary Examiner* — Feifei Yeung Lopez
(74) *Attorney, Agent, or Firm* — IPro, PLLC

(57) ABSTRACT

A displaying base plate and a fabricating method thereof. The displaying base plate includes a substrate, and a first flat layer on one side of the substrate; a first metal layer on one side of the first flat layer that is further away from the substrate; a second flat layer on sides of the first metal layer and the first flat layer that are further away from the substrate; and a second metal layer on one side of the second flat layer that is further away from the substrate; wherein the first metal layer includes a first metal trace, an orthographic projection of the second metal layer on the substrate and an orthographic projection of the first metal trace on the substrate have an overlapping part, and an orthographic projection of the second flat layer on the substrate covers the orthographic projection of the first metal trace on the substrate.

20 Claims, 6 Drawing Sheets

METHOD FOR FABRICATING DISPLAYING BASE PLATE, DISPLAYING BASE PLATE AND DISPLAYING DEVICE

CROSS REFERENCE TO RELEVANT APPLICATIONS

The present disclosure claims the priority of the Chinese patent application filed on Aug. 19, 2020 before the Chinese Patent Office with the application number of 202010838675.9 and the title of "METHOD FOR FABRICATING DISPLAYING BASE PLATE, DISPLAYING BASE PLATE AND DISPLAYING DEVICE", which is incorporated herein in its entirety by reference.

TECHNICAL FIELD

The present disclosure relates to the technical field of displaying, and particularly relates to a method for fabricating a displaying base plate, a displaying base plate and a displaying device.

BACKGROUND

LEDs, because of their advantages such as a high brightness, a wide color gamut and a long life, have been extensively applied in fields such as LED illumination and displaying. In recent years, with the further development of the technique of Mini-LED and Micro-LED chips, the technique of AM Mini-LED and AM Micro-LED displaying has been paid extensive attention to. LED driving backplanes, as the main carrier for driving LED light emission and realizing grayscale displaying, are the key to the development of the technique of LED displaying.

SUMMARY

The present disclosure provides a method for fabricating a displaying base plate, a displaying base plate and a displaying device.

The present disclosure discloses a displaying base plate, wherein the displaying base plate comprises:

a substrate, and a first flat layer on one side of the substrate;

a first metal layer, wherein the first metal layer is provided on one side of the first flat layer that is further away from the substrate;

a second flat layer, wherein the second flat layer is provided on sides of the first metal layer and the first flat layer that are further away from the substrate; and a second metal layer, wherein the second metal layer is provided on one side of the second flat layer that is further away from the substrate;

wherein the first metal layer comprises a first metal trace, an orthographic projection of the second metal layer on the substrate and an orthographic projection of the first metal trace on the substrate have an overlapping part, and an orthographic projection of the second flat layer on the substrate covers the orthographic projection of the first metal trace on the substrate.

In an optional implementation, the displaying base plate further comprises a passivation layer, the passivation layer is located between the second flat layer and the second metal layer, and an orthographic projection of the passivation layer on the substrate covers the orthographic projection of the second flat layer on the substrate.

In an optional implementation, the first metal layer further comprises a bonding block, and the bonding block and the first metal trace are insulated and separate; and the second metal layer comprises a trace region and a binding region that is connected to the trace region, an orthographic projection of the trace region on the substrate and the orthographic projection of the passivation layer on the substrate totally overlap, and an orthographic projection of the binding region on the substrate is located within a region of an orthographic projection of the bonding block on the substrate.

In an optional implementation, the binding region of the second metal layer contacts the bonding block.

In an optional implementation, the orthographic projection of the bonding block on the substrate and the orthographic projection of the second flat layer on the substrate have an overlapping part.

In an optional implementation, the orthographic projection of the bonding block on the substrate and the orthographic projection of the passivation layer on the substrate have an overlapping part.

In an optional implementation, the orthographic projection of the bonding block on the substrate and the orthographic projection of the binding region on the substrate totally overlap.

In an optional implementation, a slot is provided on the one side of the first flat layer that is further away from the substrate, the slot is located within a region of the first flat layer that is not covered by the first metal trace and the bonding block, and a depth of the slot is greater than a thickness of the first metal layer, and less than a sum between the thickness of the first metal layer and a thickness of the first flat layer.

In an optional implementation, a material of the passivation layer is one or more of silicon nitride and silicon oxide; and a thickness of the passivation layer is greater than or equal to 2000 angstroms, and less than or equal to 4000 angstroms.

In an optional implementation, the displaying base plate further comprises a light emitting device; and the first metal trace is connected to an operating-voltage output terminal of the light emitting device, and the second metal layer is connected to a common-ground-voltage terminal.

In an optional implementation, the first metal layer and the second metal layer are of a single-layer structure, and a material of the single-layer structure is one or more of Mo and Cu.

In an optional implementation, the first metal layer and the second metal layer are of a stacked-layer structure, and a material of the stacked-layer structure is Ti/Al/Ti.

The present disclosure further discloses a displaying device, wherein the displaying device comprises the displaying base plate according to any one of the above embodiments.

The present disclosure further discloses a method for fabricating a displaying base plate, wherein the fabricating method comprises:

providing a substrate;

forming a first flat layer on one side of the substrate;

patterning one side of the first flat layer that is further away from the substrate to form a first metal layer;

forming a second flat layer on sides of the first metal layer and the first flat layer that are further away from the substrate; and forming a second metal layer on one side of the second flat layer that is further away from the substrate;

wherein the first metal layer comprises a first metal trace, an orthographic projection of the second metal layer on the substrate and an orthographic projection of the first metal trace on the substrate have an overlapping part, and an orthographic projection of the second flat layer on the substrate covers the orthographic projection of the first metal trace on the substrate.

In an optional implementation, after the step of forming the second flat layer on the sides of the first metal layer and the first flat layer that are further away from the substrate, the method further comprises:

forming a passivation layer on the one side of the second flat layer that is further away from the substrate, wherein an orthographic projection of the passivation layer on the substrate covers the orthographic projection of the second flat layer on the substrate; and forming the second metal layer on one side of the passivation layer that is further away from the substrate.

In an optional implementation, the step of patterning the one side of the first flat layer that is further away from the substrate to form the first metal layer comprises:

patterning the one side of the first flat layer that is further away from the substrate to form a first metal trace and a bonding block, wherein the bonding block and the first metal trace are insulated and separate.

In an optional implementation, after the step of patterning the one side of the first flat layer that is further away from the substrate to form the first metal trace and the bonding block, the method further comprises:

forming the second flat layer on sides of the first metal trace, the first flat layer and the bonding block that are further away from the substrate;

forming a passivation layer on the sides of the second flat layer and the bonding block that are further away from the substrate; and forming the second metal layer on one side of the passivation layer and one exposed side of the bonding block that are further away from the substrate.

In an optional implementation, materials of the first flat layer and the second flat layer are a resin.

In an optional implementation, a thickness of the first flat layer and a thickness of the second flat layer are 2 μm.

The above description is merely a summary of the technical solutions of the present disclosure. In order to more clearly know the elements of the present disclosure to enable the implementation according to the contents of the description, and in order to make the above and other purposes, features and advantages of the present disclosure more apparent and understandable, the particular embodiments of the present disclosure are provided below.

BRIEF DESCRIPTION OF THE DRAWINGS

In order to more clearly illustrate the technical solutions of the embodiments of the present disclosure, the figures that are required to describe the embodiments of the present disclosure will be briefly introduced below. Apparently, the figures that are described below are embodiments of the present disclosure, and a person skilled in the art can obtain other figures according to these figures without paying creative work.

DETAILED DESCRIPTION

In order to make the above purposes, features and advantages of the present disclosure more apparent and understandable, the present disclosure will be described in further detail below with reference to the drawings and the particular embodiments. Apparently, the described embodiments are merely certain embodiments of the present disclosure, rather than all of the embodiments. All of the other embodiments that a person skilled in the art obtains on the basis of the embodiments of the present disclosure without paying creative work fall within the protection scope of the present disclosure.

Figure 1:
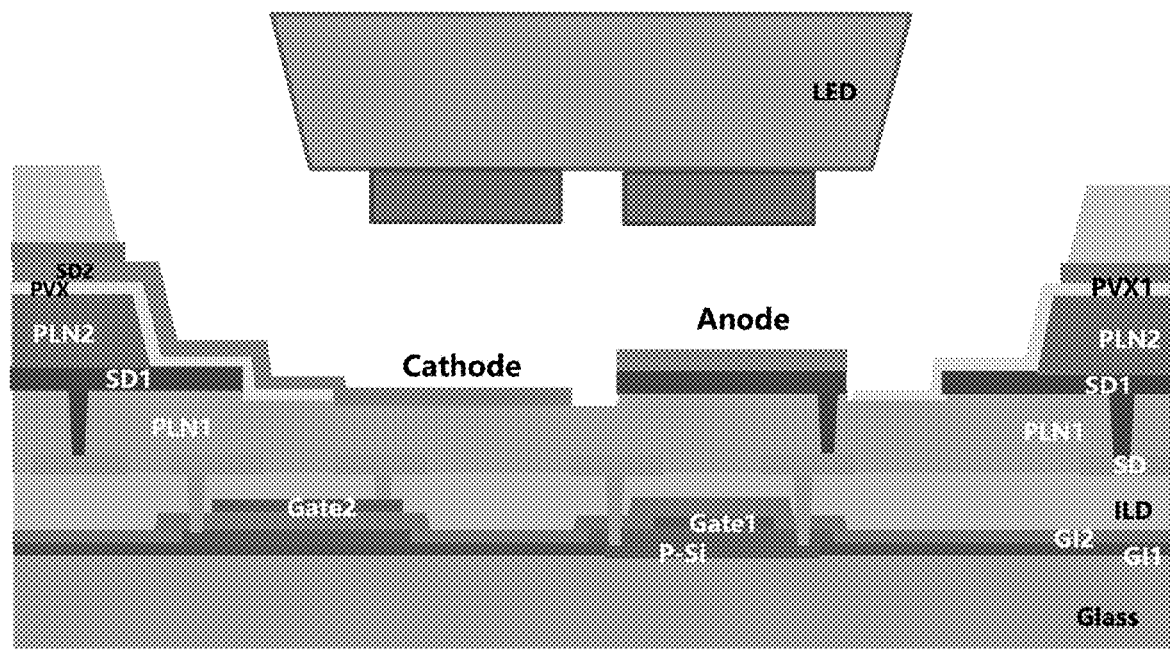
FIG. 1 shows a schematic sectional structural diagram of a displaying base plate in the related art.

Referring to FIG. 1, FIG. 1 shows a schematic sectional structural diagram of a displaying base plate in the related art. In order to achieve the goal of reducing the voltage drop (i.e., IR Drop), a device structure of three metal layers (comprising SD1 and SD2) and two flat layers (including PLN1 and PLN2) is employed. SD1 transmits the signal of the operating voltage VDD of the LED device, and SD2 transmits the signal of a common ground voltage VSS. The VDD signal is modulated by a pixel circuit, to obtain an ideal anode driving voltage, which is transmitted into an anode terminal, and the VSS signal is transmitted into a cathode terminal. The two terminals of the LED are connected to the anode terminal and the cathode terminal, and the voltage difference between the anode terminal and the cathode terminal drives the LED to emit light, to realize grayscale controlling. The pixel circuit may be pixel driving circuits such as 2T1C and 7T1C, which is not limited herein.

However, the displaying base plate in the related art easily has short-circuit imperfect between the VDD signal and the VSS signal. The inventor has analyzed the imperfect. Referring to the Scanning Electron Microscope (SEM) picture of a cross section shown in FIG. 2, and referring to the schematic sectional structural diagram of the short-circuit position shown in FIG. 3, the SD2 and SD1 traces have an overlapping region therebetween. However, SD1 and SD2 have merely a passivation layer (PVX1) of the thickness of approximately 2000 angstroms therebetween, and, therefore, in the etching of SD1, PLN1 has inevitable over-etching. The PLN1 over-etching results in a large segment gap at a position 1, which results in that PVX1 cannot completely cover SD1 at the position 1 (the inorganic material PVX1 easily breaks at a position of a large segment gap), and in turn results in that SD1 and SD2 have short-circuit imperfect at the position 1.

Figure 4:
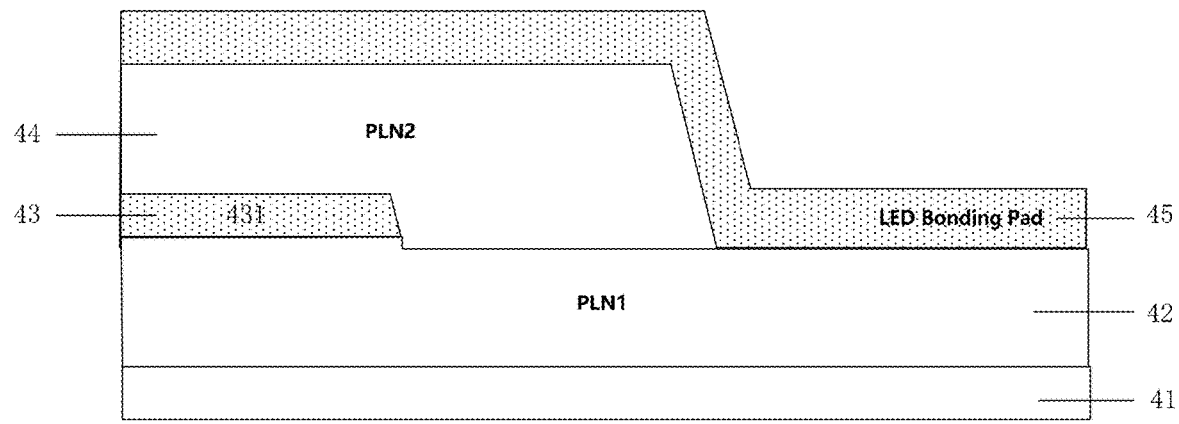
FIG. 4 shows a schematic sectional structural diagram of a first displaying base plate according to an embodiment of the present disclosure.

In order to solve the short-circuit imperfect between the VDD signal and the VSS signal, an embodiment of the present disclosure provides a displaying base plate. Referring to FIG. 4, the displaying base plate may comprise: a substrate 41, and a first flat layer 42 on one side of the substrate 41; a first metal layer 43 on one side of the first flat layer 42 that is further away from the substrate 41; a second flat layer 44 on the sides of the first metal layer 43 and the first flat layer 42 that are further away from the substrate 41; and a second metal layer 45 on one side of the second flat layer 44 that is further away from the substrate 41.

The first metal layer 43 may comprise a first metal trace 431, the orthographic projection of the second metal layer 45 on the substrate 41 and the orthographic projection of the first metal trace 431 on the substrate 41 have an overlapping part, and the orthographic projection of the second flat layer 44 on the substrate 41 covers the orthographic projection of the first metal trace 431 on the substrate 41.

The first metal layer 43 and the second metal layer 45 may be of a single-layer structure, and the material may be one or more metal materials such as Mo and Cu. The first metal layer 43 and the second metal layer 45 may also be of a stacked-layer structure, and the material of the laminate may be metal materials such as Ti/Al/Ti. In a particular implementation, the materials and the structures of the first metal layer and the second metal layer may be selected according to practical demands, and are not limited in the present embodiment.

The displaying base plate may also comprise a light emitting device such as OLED and LED. The first metal trace 431 may be connected to an output terminal of the operating voltage VDD of the light emitting device. The second metal layer 45 may be connected to a terminal of the common ground voltage VSS. In a particular implementation, the first metal trace and the second metal layer may also be connected to other signal output terminals, and the signals transmitted by the first metal trace and the second metal layer are not limited in the present embodiment.

The substrate 41 may comprise a glass or flexible base plate, and a structure such as a TFT array unit and a signal line that is provided on one side closer to the first flat layer 42.

Referring to FIG. 4, when the orthographic projections of the first metal trace 431 and the second metal layer 45 on the substrate 41 have an overlapping part, the orthographic projection of the first metal trace 431 on the substrate 41 is located within the region of the orthographic projection of the second flat layer 44 on the substrate 41; in other words, the edge of the first metal trace 431 is retracted into the second flat layer 44, whereby the second flat layer 44 effectively wraps and covers the first metal trace 431, thereby effectively preventing short circuit between the first metal trace 431 and the second metal layer 45, and solving the problem of short circuit between the VSS signal and the VDD signal.

Figure 5:
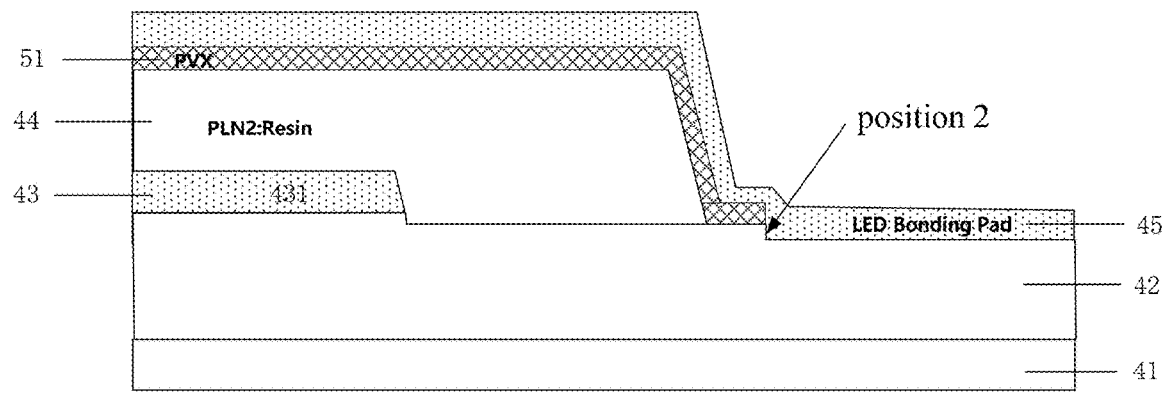
FIG. 5 shows a schematic sectional structural diagram of a second displaying base plate according to an embodiment of the present disclosure.

In an optional implementation, Referring to FIG. 5, the displaying base plate may further comprise: a passivation layer 51 between the second flat layer 44 and the second metal layer 45. The orthographic projection of the passivation layer 51 on the substrate 41 covers the orthographic projection of the second flat layer 44 on the substrate 41; in other words, the orthographic projection of the second flat layer 44 on the substrate 41 is located within the region of the orthographic projection of the passivation layer 51 on the substrate 41.

The material of the passivation layer 51 may be one or more inorganic materials such as silicon nitride and silicon oxide. The thickness of the passivation layer 51 may be greater than or equal to 2000 angstroms and less than or equal to 4000 angstroms. In a particular implementation, the material and the thickness of the passivation layer may be selected according to practical demands, and the material and the thickness of the passivation layer are not limited in the present embodiment.

The passivation layer 51 can improve the adhesivity between the second metal layer 45 and the second flat layer 44, and can prevent corrosion on the second metal layer 45 by the organic gases diffused from the second flat layer 44.

Figure 2:
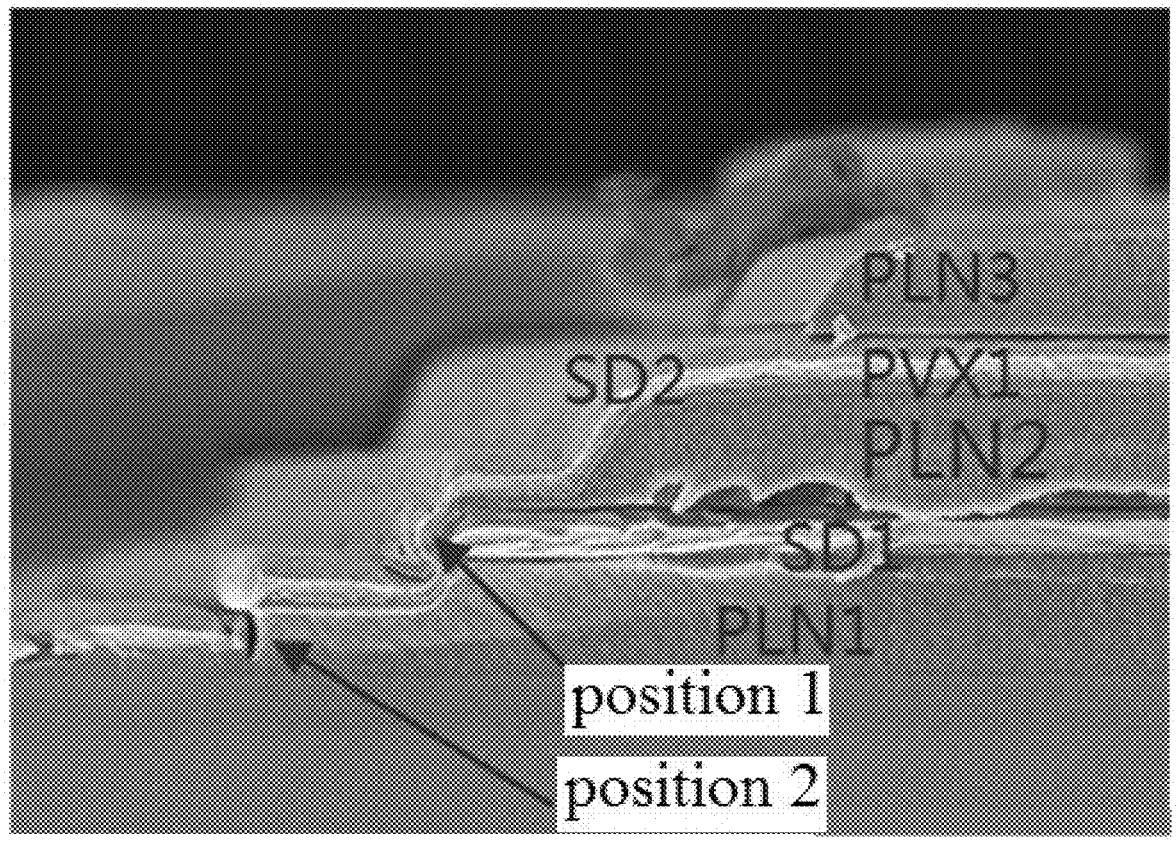
FIG. 2 shows an SEM cross-sectional view of a displaying base plate in the related art.
Figure 3:
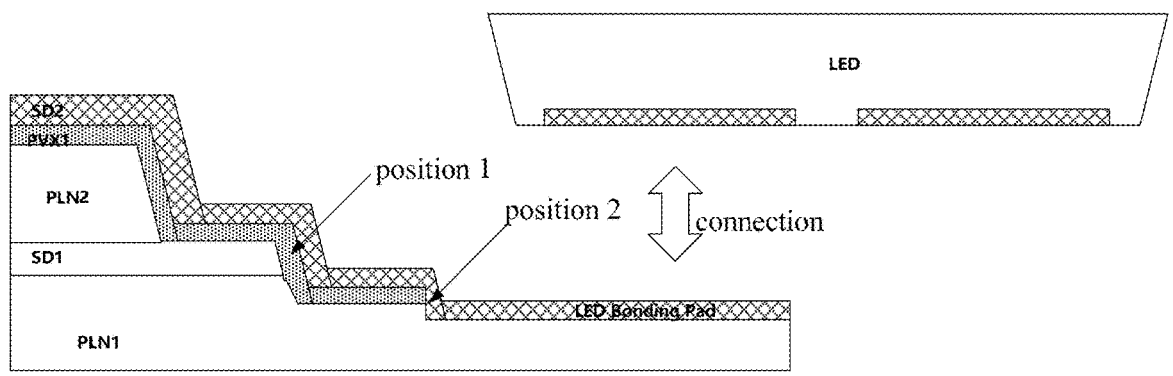
FIG. 3 shows a partially enlarged schematic sectional structural diagram of a displaying base plate in the related art.

The inventor has further found that, referring to FIGS. 2, 3 and 5, in dry etching of PVX1 or the passivation layer 51, over-etching of PLN1 or the first flat layer 42 easily happens, whereby the segment gap and the angle of gradient at the position 2 are large, which easily results in open-circuit imperfect of SD2 or the second metal layer 45 at the position 2.

Figure 6:
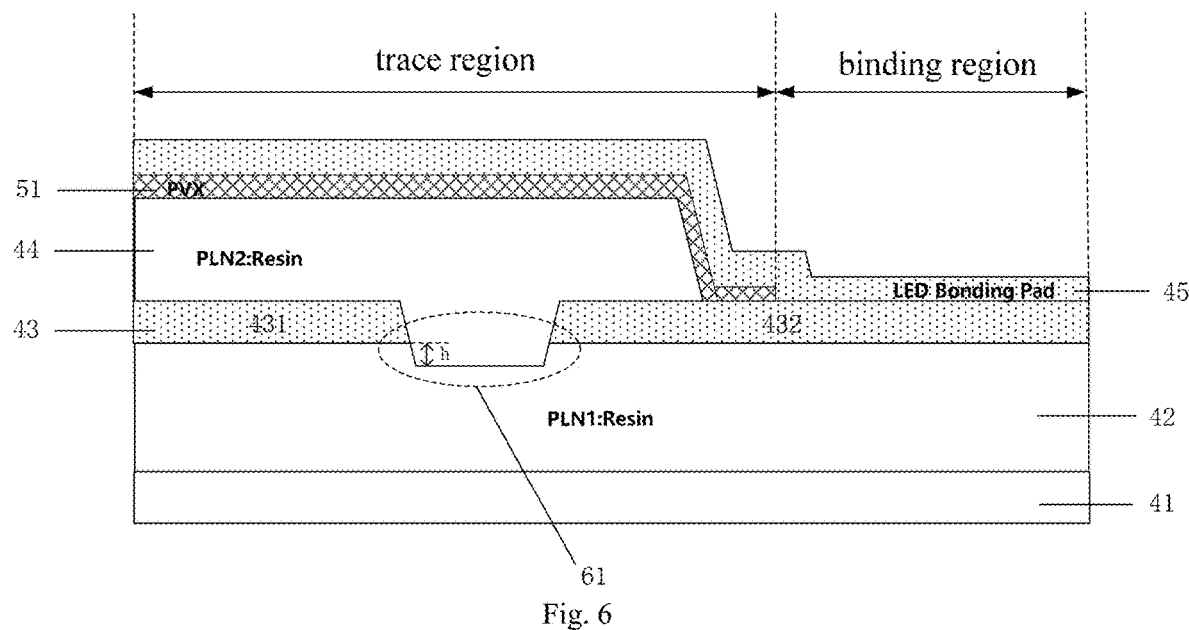
FIG. 6 shows a schematic sectional structural diagram of a third displaying base plate according to an embodiment of the present disclosure.

In order to solve the open-circuit imperfect of the second metal layer, referring to FIG. 6, on the basis of the above embodiments, the first metal layer 43 may further comprise a bonding block 432, the bonding block 432 and the first metal trace 431 are insulated and separate, the second metal layer 45 comprises a trace region and a binding region that is connected to the trace region, the orthographic projection of the trace region on the substrate 41 and the orthographic projection of the passivation layer 51 on the substrate 41 totally overlap, and the orthographic projection of the binding region on the substrate 41 is located within the region of the orthographic projection of the bonding block 432 on the substrate 41.

Because the orthographic projection of the bonding block 432 on the substrate 41 totally covers the orthographic projection of the binding region on the substrate 41, in dry etching of the passivation layer 51, the bonding block 432 may serve as a hard mask to protect the first flat layer 42 under it from over-etching, to prevent the first flat layer 42 from forming a step of a large segment gap, and solve the problem of open circuit of the second metal layer 45.

In practical applications, the bonding block 432 is merely required to cover the region under the second metal layer 45 that is not covered by the passivation layer 51. For example, the orthographic projection of the bonding block 432 on the substrate 41 may totally overlap with the orthographic projection of the binding region on the substrate 41, or the orthographic projection of the bonding block 432 on the substrate 41 totally covers the orthographic projection of the binding region on the substrate 41, and the orthographic projection of the bonding block 432 on the substrate 41 and the orthographic projection of the passivation layer 51 on the substrate 41 have an overlapping part. Alternatively, as shown in FIG. 6, the orthographic projection of the bonding block 432 on the substrate 41 totally covers the orthographic projection of the binding region on the substrate 41, and the orthographic projection of the bonding block 432 on the substrate 41 and the orthographic projection of the second flat layer 44 on the substrate 41 have an overlapping part.

As shown in FIG. 6, a slot 61 is provided on the one side of the first flat layer 42 that is further away from the substrate 41, and the slot 61 is located within the region of the first flat layer 42 that is not covered by the first metal trace 431 and the bonding block 432. The depth h of the slot 61 is greater than the thickness of the first metal layer 43, and less than the sum of the thicknesses of the first metal layer 43 and the first flat layer 42. The slot 61 may be formed by over-etching of the first flat layer 42 in the process of the dry etching of the first metal layer 43.

The connection between the second metal layer 45 and the terminal of the common ground voltage VSS may be the connection between the trace region of the second metal layer 45 and the terminal of the common ground voltage VSS. The binding region of the second metal layer 45 contacts the bonding block 432, and, at this point, the bonding block 432 forms a suspending pad.

By providing a supporting bonding block at the corresponding position of the binding region of the second metal layer, the film-layer overlapping structure shown in FIG. 6 is formed, and the structure can raise the deep hole of the binding region, which can prevent the formation of a step of a large segment gap in the binding region caused by the PVX dry etching of the passivation layer, thereby effectively preventing open-circuit imperfect of the second metal layer itself, and preventing photoresist residual.

In the displaying base plate according to the present embodiment, by configuring that the first metal trace is retracted into the second flat layer, the second flat layer effectively wraps and covers the first metal trace, thereby preventing short-circuit imperfect between the first metal trace and the second metal layer. Further, by providing a supporting bonding block in the binding region (at the position of the cathode terminal), a suspending pad is formed, which prevents the formation of a step of a large segment gap in the process of the PVX dry etching of the passivation layer, thereby preventing open-circuit imperfect of the cathode terminal, and preventing photoresist residual.

Another embodiment of the present disclosure further provides a displaying device, wherein the displaying device comprises the displaying base plate according to any one of the above embodiments.

It should be noted that the displaying device according to the present embodiment may be any products or components that have the function of 2D or 3D displaying, such as a display panel, an electronic paper, a mobile phone, a tablet personal computer, a TV set, a notebook computer, a digital photo frame and a navigator.

Figure 7:
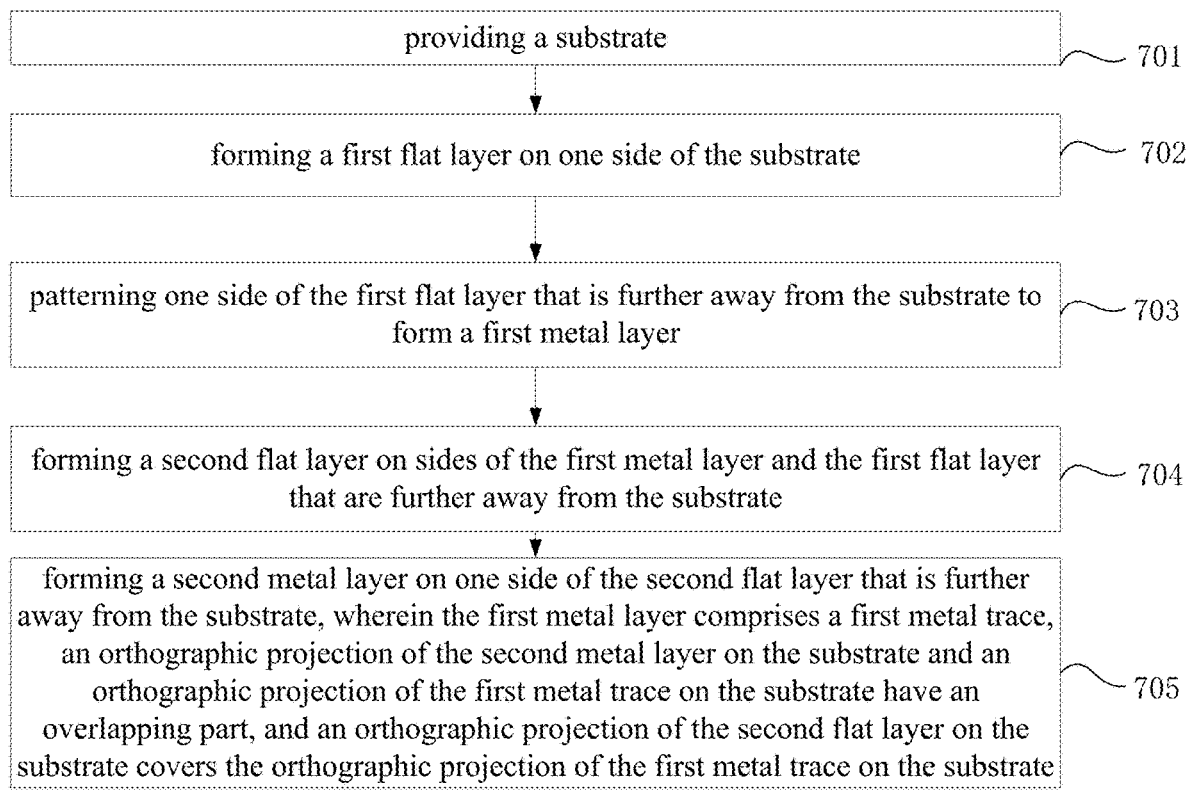
FIG. 7 shows a flow chart of a first method for fabricating a displaying base plate according to an embodiment of the present disclosure.

In order to solve the open-circuit imperfect, an embodiment of the present disclosure provides a method for fabricating a displaying base plate. Referring to FIG. 7, the fabricating method may comprise:

Step 701: providing a substrate.

Step 702: forming a first flat layer on one side of the substrate.

The first flat layer may be spread-coated on one side of the substrate. The material of the first flat layer may be a resin, and the thickness is approximately 2 μm.

Step 703: patterning one side of the first flat layer that is further away from the substrate to form a first metal layer.

The material of the first metal layer may be Ti/Al/Ti or Mo.

On one side of the first flat layer that is further away from the substrate, the first metal layer may be formed by using a series of patterning processes such as metal-material deposition, photoresist spread coating, exposure, development, dry etching and photoresist stripping.

Step 704: forming a second flat layer on sides of the first metal layer and the first flat layer that are further away from the substrate.

The pattern of the second flat layer may be formed by using a series of patterning processes such as spread coating, exposure and ashing on the sides of the first metal layer and the first flat layer that are further away from the substrate. The material of the second flat layer may be a resin, and the thickness is approximately 2 μm.

Step 705: forming a second metal layer on one side of the second flat layer that is further away from the substrate, wherein the first metal layer comprises a first metal trace, an orthographic projection of the second metal layer on the substrate and an orthographic projection of the first metal trace on the substrate have an overlapping part, and an orthographic projection of the second flat layer on the substrate covers the orthographic projection of the first metal trace on the substrate.

The material of the second metal layer may be copper. The required pattern of the second metal layer may be formed by using a series of patterning processes such as metal-material deposition, photoresist spread coating, exposure, development, wet etching and photoresist stripping.

By using the fabricating method according to the present embodiment, the displaying base plate shown in FIG. 4 can be obtained.

Figure 8:
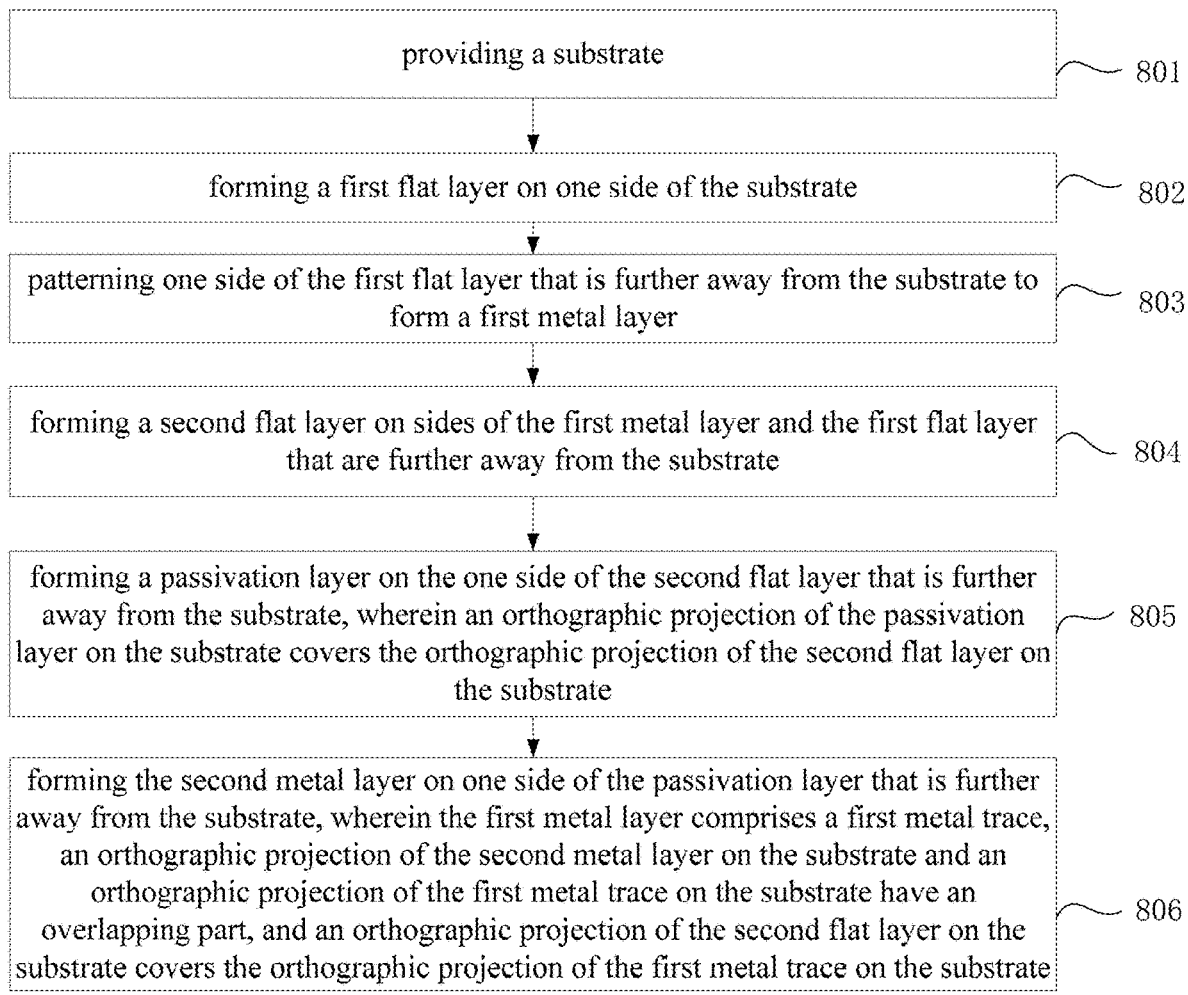
FIG. 8 shows a flow chart of a second method for fabricating a displaying base plate according to an embodiment of the present disclosure.

Referring to FIG. 8, another embodiment provides a method for fabricating a displaying base plate, comprising:

Step 801: providing a substrate.

Step 802: forming a first flat layer on one side of the substrate.

Step 803: patterning one side of the first flat layer that is further away from the substrate to form a first metal layer.

Step 804: forming a second flat layer on sides of the first metal layer and the first flat layer that are further away from the substrate.

The step 801 to the step 804 according to the present embodiment are the same as or similar to the step 701 to the step 704 according to the last embodiment, and are not discussed herein further.

Step 805: forming a passivation layer on the one side of the second flat layer that is further away from the substrate, wherein an orthographic projection of the passivation layer on the substrate covers the orthographic projection of the second flat layer on the substrate.

The material of the passivation layer may be silicon nitride or silicon oxide, and the thickness may range from 2000 angstroms to 4000 angstroms.

Step 806: forming the second metal layer on one side of the passivation layer that is further away from the substrate, wherein the first metal layer comprises a first metal trace, an orthographic projection of the second metal layer on the substrate and an orthographic projection of the first metal trace on the substrate have an overlapping part, and an orthographic projection of the second flat layer on the substrate covers the orthographic projection of the first metal trace on the substrate.

The material of the second metal layer may be copper. The passivation layer can improve the adhesivity between Cu and the second flat layer, and can prevent corrosion on Cu by organic gases.

By using the fabricating method according to the present embodiment, the displaying base plate shown in FIG. 5 can be obtained.

Figure 9:
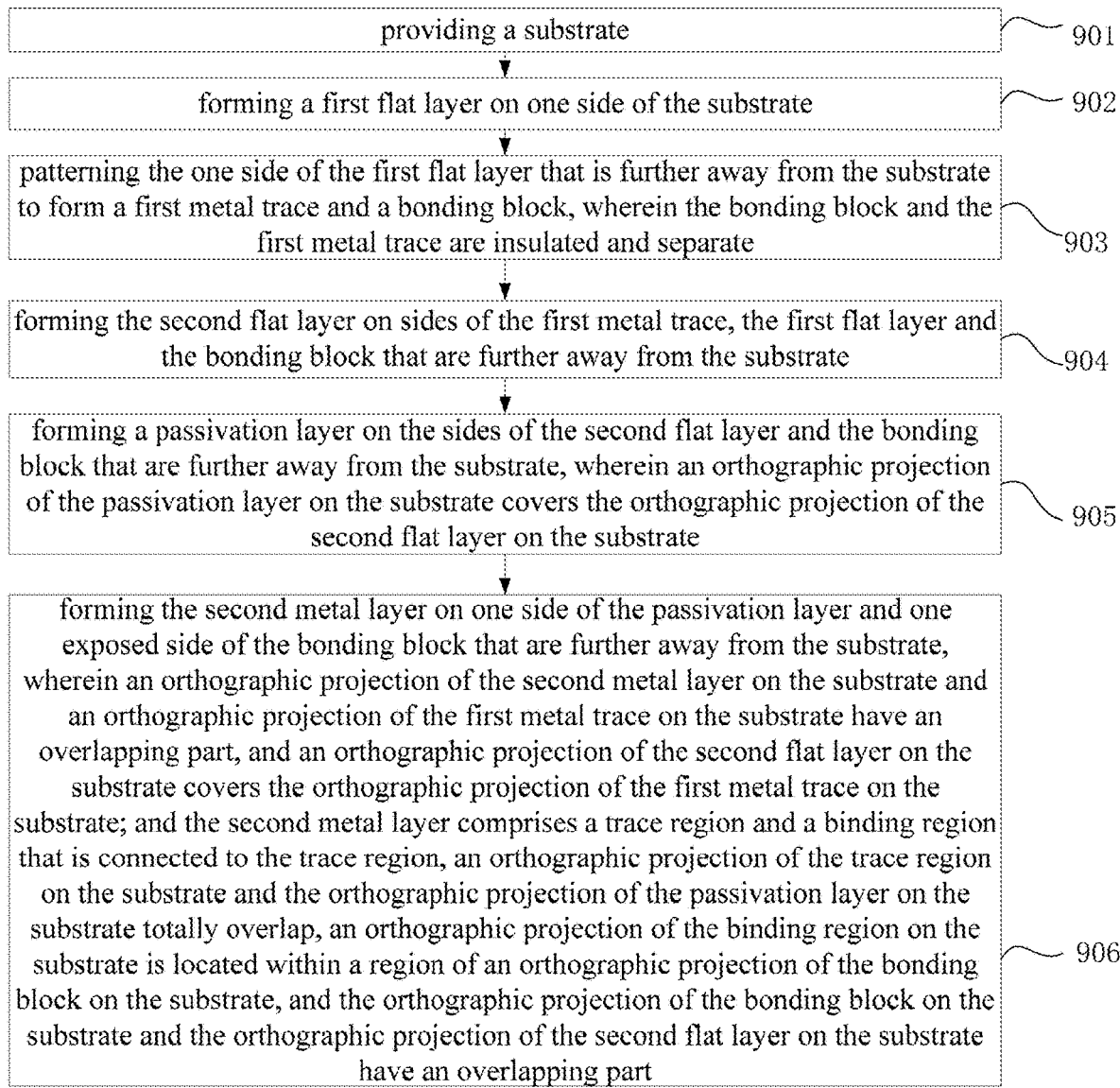
FIG. 9 shows a flow chart of a third method for fabricating a displaying base plate according to an embodiment of the present disclosure.

In order to solve the problem of open circuit of the second metal layer, the first metal layer may further comprise a bonding block, and, referring to FIG. 9, another embodiment provides a method for fabricating a displaying base plate, comprising:

Step 901: providing a substrate.

Step 902: forming a first flat layer on one side of the substrate.

Step 903: patterning the one side of the first flat layer that is further away from the substrate to form a first metal trace and a bonding block, wherein the bonding block and the first metal trace are insulated and separate.

In the dry-etching process for forming the first metal trace and the bonding block, the exposed surface of the first flat layer has over-etching, or, in other words, the region of the first flat layer that is not covered by the first metal trace and the bonding block has over-etching, thereby forming the slot structure shown in FIG. 6. The depth of the slot may be greater than the thickness of the first metal layer, and less than the sum between the thickness of the first metal layer and the thickness of the first flat layer.

Step 904: forming the second flat layer on sides of the first metal trace, the first flat layer and the bonding block that are further away from the substrate.

Step 905: forming a passivation layer on the sides of the second flat layer and the bonding block that are further away from the substrate, wherein an orthographic projection of the passivation layer on the substrate covers the orthographic projection of the second flat layer on the substrate.

Step 906: forming the second metal layer on one side of the passivation layer and one exposed side of the bonding block that are further away from the substrate, wherein an orthographic projection of the second metal layer on the substrate and an orthographic projection of the first metal trace on the substrate have an overlapping part, and an orthographic projection of the second flat layer on the substrate covers the orthographic projection of the first metal trace on the substrate; and the second metal layer comprises a trace region and a binding region that is connected to the trace region, an orthographic projection of the trace region on the substrate and the orthographic projection of the passivation layer on the substrate totally overlap, an orthographic projection of the binding region on the substrate is located within a region of an orthographic projection of the bonding block on the substrate, and the orthographic projection of the bonding block on the substrate and the orthographic projection of the second flat layer on the substrate have an overlapping part.

By using the fabricating method according to the present embodiment, the displaying base plate shown in FIG. 6 can be obtained.

In order to solve the problem of open circuit of the second metal layer, the first metal layer may further comprise a bonding block, and another embodiment provides a method for fabricating a displaying base plate, comprising:

providing a substrate;

forming a first flat layer on one side of the substrate;

patterning the one side of the first flat layer that is further away from the substrate to form a first metal trace and a bonding block, wherein the bonding block and the first metal trace are insulated and separate;

forming a second flat layer on sides of the first metal layer and the first flat layer that are further away from the substrate;

forming a passivation layer on the sides of the second flat layer and the bonding block that are further away from the substrate, wherein an orthographic projection of the passivation layer on the substrate covers the orthographic projection of the second flat layer on the substrate; and forming the second metal layer on one side of the passivation layer and one exposed side of the bonding block that are further away from the substrate, wherein an orthographic projection of the second metal layer on the substrate and an orthographic projection of the first metal trace on the substrate have an overlapping part, and an orthographic projection of the second flat layer on the substrate covers the orthographic projection of the first metal trace on the substrate; and the second metal layer comprises a trace region and a binding region that is connected to the trace region, an orthographic projection of the trace region on the substrate and the orthographic projection of the passivation layer on the substrate totally overlap, an orthographic projection of the binding region on the substrate is located within a region of an orthographic projection of the bonding block on the substrate, and the orthographic projection of the bonding block on the substrate and the orthographic projection of the passivation layer on the substrate have an overlapping part.

In order to solve the problem of open circuit of the second metal layer, the first metal layer may further comprise a bonding block, and another embodiment provides a method for fabricating a displaying base plate, comprising:

providing a substrate;

forming a first flat layer on one side of the substrate;

patterning the one side of the first flat layer that is further away from the substrate to form a first metal trace and a bonding block, wherein the bonding block and the first metal trace are insulated and separate;

forming a second flat layer on sides of the first metal layer and the first flat layer that are further away from the substrate;

forming a passivation layer on the sides of the second flat layer and the first flat layer that are further away from the substrate, wherein an orthographic projection of the passivation layer on the substrate covers the orthographic projection of the second flat layer on the substrate; and forming a second metal layer on the sides of the passivation layer and the bonding block that are further away from the substrate, wherein an orthographic projection of the second metal layer on the substrate and an orthographic projection of the first metal trace on the substrate have an overlapping part, and an orthographic projection of the second flat layer on the substrate covers the orthographic projection of the first metal trace on the substrate; and the second metal layer comprises a trace region and a binding region that is connected to the trace region, an orthographic projection of the trace region on the substrate and the orthographic projection of the passivation layer on the substrate totally overlap, the orthographic projection of the bonding block on the substrate and the orthographic projection of the binding region on the substrate totally overlap.

The embodiments of the present disclosure provide a method for fabricating a displaying base plate, a displaying base plate and a displaying device, wherein the displaying base plate comprises a substrate and a first flat layer on one side of the substrate; a first metal layer on one side of the first flat layer that is further away from the substrate; a second flat layer on sides of the first metal layer and the first flat layer that are further away from the substrate; and a second metal layer on one side of the second flat layer that is further away from the substrate; wherein the first metal layer comprises a first metal trace, an orthographic projection of the second metal layer on the substrate and an orthographic projection of the first metal trace on the substrate have an overlapping part, and an orthographic projection of the second flat layer on the substrate covers the orthographic projection of the first metal trace on the substrate. The technical solutions according to the present disclosure, by providing the structure, at the position of the overlapping between the first metal trace and the second metal layer, in which the second flat layer wraps the first metal trace, can effectively prevent short-circuit imperfect between the first metal trace and the second metal layer.

The embodiments of the description are described in the mode of progression, each of the embodiments emphatically describes the differences from the other embodiments, and the same or similar parts of the embodiments may refer to each other.

Finally, it should also be noted that, in the present text, relation terms such as first and second are merely intended to distinguish one entity or operation from another entity or operation, and that does not necessarily require or imply that those entities or operations have therebetween any such actual relation or order. Furthermore, the terms "include", "comprise" or any variants thereof are intended to cover non-exclusive inclusions, so that processes, methods, articles or devices that include a series of elements do not only include those elements, but also include other elements that are not explicitly listed, or include the elements that are inherent to such processes, methods, articles or devices. Unless further limitation is set forth, an element defined by the wording "comprising a . . . " does not exclude additional same element in the process, method, article or device comprising the element.

The method for fabricating the displaying base plate, the displaying base plate and the displaying device according to the present disclosure have been described in detail above. The principle and the embodiments of the present disclosure are described herein with reference to the particular examples, and the description of the above embodiments is merely intended to facilitate to understand the method according to the present disclosure and its core concept. Moreover, for a person skilled in the art, according to the concept of the present disclosure, the particular embodiments and the range of application may be varied. In conclusion, the contents of the description should not be understood as limiting the present disclosure.

The invention claimed is:

1. A displaying base plate, wherein the displaying base plate comprises:
   a substrate, and a first flat layer on one side of the substrate;
   a first metal layer, wherein the first metal layer is provided on one side of the first flat layer that is further away from the substrate;
   a second flat layer, wherein the second flat layer is provided on sides of the first metal layer and the first flat layer that are further away from the substrate; and
   a second metal layer, wherein the second metal layer is provided on one side of the second flat layer that is further away from the substrate;
   wherein the first metal layer comprises a first metal trace, an orthographic projection of the second metal layer on the substrate and an orthographic projection of the first metal trace on the substrate have an overlapping part, and an orthographic projection of the second flat layer on the substrate covers the orthographic projection of the first metal trace on the substrate;
   wherein the displaying base plate further comprises a passivation layer, the passivation layer is located between the second flat layer and the second metal layer, and an orthographic projection of the passivation layer on the substrate covers the orthographic projection of the second flat layer on the substrate;
   wherein the first metal layer further comprises a bonding block, and the bonding block and the first metal trace are insulated and separate; and
   the second metal layer comprises a trace region and a binding region that is connected to the trace region, and the bonding block is located between the substrate and the second metal layer;
   wherein the binding region of the second metal layer contacts the bonding block.

2. The displaying base plate according to claim 1, wherein the orthographic projection of the bonding block on the substrate and the orthographic projection of the second flat layer on the substrate have an overlapping part.

3. The displaying base plate according to claim 1, wherein the orthographic projection of the bonding block on the substrate and the orthographic projection of the passivation layer on the substrate have an overlapping part.

4. The displaying base plate according to claim 1, wherein the orthographic projection of the bonding block on the substrate and the orthographic projection of the binding region on the substrate totally overlap.

5. A displaying base plate, wherein the displaying base plate comprises:
   a substrate, and a first flat layer on one side of the substrate;
   a first metal layer, wherein the first metal layer is provided on one side of the first flat layer that is further away from the substrate;
   a second flat layer, wherein the second flat layer is provided on sides of the first metal layer and the first flat layer that are further away from the substrate; and
   a second metal layer, wherein the second metal layer is provided on one side of the second flat layer that is further away from the substrate;
   wherein the first metal layer comprises a first metal trace, an orthographic projection of the second metal layer on the substrate and an orthographic projection of the first metal trace on the substrate have an overlapping part, and an orthographic projection of the second flat layer on the substrate covers the orthographic projection of the first metal trace on the substrate;
   wherein the displaying base plate further comprises a passivation layer, the passivation layer is located between the second flat layer and the second metal layer, and an orthographic projection of the passivation layer on the substrate covers the orthographic projection of the second flat layer on the substrate;
   wherein the first metal layer further comprises a bonding block, and the bonding block and the first metal trace are insulated and separate; and
   the second metal layer comprises a trace region and a binding region that is connected to the trace region, and the bonding block is located between the substrate and the second metal layer;
   wherein a slot is provided on the one side of the first flat layer that is further away from the substrate, the slot is located within a region of the first flat layer that is not covered by the first metal trace and the bonding block, and a depth of the slot is greater than a thickness of the first metal layer, and less than a sum between the thickness of the first metal layer and a thickness of the first flat layer.

6. The displaying base plate according to claim 1, wherein a material of the passivation layer is one or more of silicon nitride and silicon oxide; and
   a thickness of the passivation layer is greater than or equal to 2000 angstroms, and less than or equal to 4000 angstroms.

7. The displaying base plate according to claim 1, wherein the displaying base plate further comprises a light emitting device; and
the first metal trace is connected to an operating-voltage output terminal of the light emitting device, and the second metal layer is connected to a common-ground-voltage terminal.

8. The displaying base plate according to claim 1, wherein the first metal layer and the second metal layer are of a single-layer structure, and a material of the single-layer structure is one or more of Mo and Cu.

9. The displaying base plate according to claim 1, wherein the first metal layer and the second metal layer are of a stacked-layer structure, and a material of the stacked-layer structure is Ti/Al/Ti.

10. A displaying device, wherein the displaying device comprises the displaying base plate according to claim 1.

11. A method for fabricating a displaying base plate, wherein the fabricating method comprises:
providing a substrate;
forming a first flat layer on one side of the substrate;
patterning one side of the first flat layer that is further away from the substrate to form a first metal layer;
forming a second flat layer on sides of the first metal layer and the first flat layer that are further away from the substrate; and
forming a second metal layer on one side of the second flat layer that is further away from the substrate;
wherein the first metal layer comprises a first metal trace, an orthographic projection of the second metal layer on the substrate and an orthographic projection of the first metal trace on the substrate have an overlapping part, and an orthographic projection of the second flat layer on the substrate covers the orthographic projection of the first metal trace on the substrate;
wherein the displaying base plate further comprises a passivation layer, the passivation layer is located between the second flat layer and the second metal layer, and an orthographic projection of the passivation layer on the substrate covers the orthographic projection of the second flat layer on the substrate;
wherein the first metal layer further comprises a bonding block, and the bonding block and the first metal trace are insulated and separate; and
the bonding block is located between the substrate and the second metal layer;
wherein the binding region of the second metal layer contacts the bonding block.

12. The method for fabricating a displaying base plate according to claim 11, wherein after the step of patterning the one side of the first flat layer that is further away from the substrate to form the first metal trace and the bonding block, the method further comprises:
forming the second flat layer on sides of the first metal trace, the first flat layer and the bonding block that are further away from the substrate;
forming a passivation layer on the sides of the second flat layer and the bonding block that are further away from the substrate, wherein an orthographic projection of the passivation layer on the substrate covers the orthographic projection of the second flat layer on the substrate; and
forming the second metal layer on one side of the passivation layer and one exposed side of the bonding block that are further away from the substrate.

13. The method for fabricating a displaying base plate according to claim 11, wherein materials of the first flat layer and the second flat layer are a resin.

14. The method for fabricating a displaying base plate according to claim 11, wherein a thickness of the first flat layer and a thickness of the second flat layer are 2 μm.

15. The displaying base plate according to claim 1, wherein an orthographic projection of the trace region on the substrate and the orthographic projection of the passivation layer on the substrate totally overlap, and an orthographic projection of the binding region on the substrate is located within a region of an orthographic projection of the bonding block on the substrate.

16. The displaying base plate according to claim 5, wherein an orthographic projection of the trace region on the substrate and the orthographic projection of the passivation layer on the substrate totally overlap, and an orthographic projection of the binding region on the substrate is located within a region of an orthographic projection of the bonding block on the substrate.

17. The displaying base plate according to claim 16, wherein
the binding region of the second metal layer contacts the bonding block.

18. The displaying base plate according to claim 16, wherein
the orthographic projection of the bonding block on the substrate and the orthographic projection of the second flat layer on the substrate have an overlapping part.

19. The displaying base plate according to claim 16, wherein the orthographic projection of the bonding block on the substrate and the orthographic projection of the passivation layer on the substrate have an overlapping part.

20. The displaying base plate according to claim 16, wherein
the orthographic projection of the bonding block on the substrate and the orthographic projection of the binding region on the substrate totally overlap.

\* \* \* \* \*